US008787035B2

(12) United States Patent
Mason et al.

(10) Patent No.: US 8,787,035 B2
(45) Date of Patent: Jul. 22, 2014

(54) ELECTRICAL INTERCONNECT DEVICE

(75) Inventors: Jeffery W. Mason, North Attleboro, MA (US); Wayne S. Alden, III, Whitman, MA (US); William B. Murphy, Brockton, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 311 days.

(21) Appl. No.: 13/080,505

(22) Filed: Apr. 5, 2011

(65) Prior Publication Data

US 2012/0257366 A1 Oct. 11, 2012

(51) Int. Cl.
*H05K 7/04* (2006.01)
*H05K 7/02* (2006.01)

(52) U.S. Cl.
USPC .......... 361/807

(58) Field of Classification Search
USPC .......... 361/807
See application file for complete search history.

(56) References Cited

U.S. PATENT DOCUMENTS 5,022,869 A * 6/1991 Walker .......... 439/526
5,073,116 A * 12/1991 Beck, Jr. .......... 439/71
5,375,710 A * 12/1994 Hayakawa et al. .......... 206/724
5,573,427 A * 11/1996 Sagano .......... 439/526
5,713,744 A * 2/1998 Laub .......... 439/71
5,793,618 A * 8/1998 Chan et al. .......... 361/809
6,164,980 A * 12/2000 Goodwin .......... 439/70
6,210,197 B1 * 4/2001 Yu .......... 439/342
6,271,482 B1 * 8/2001 Crotzer et al. .......... 174/262
6,400,577 B1 * 6/2002 Goodwin et al. .......... 361/816
6,442,045 B1 * 8/2002 Goodwin et al. .......... 361/816
6,545,879 B1 * 4/2003 Goodwin .......... 361/807
6,733,304 B1 * 5/2004 Liao .......... 439/66
6,780,056 B1 * 8/2004 Neidich .......... 439/607.35
6,796,805 B2 9/2004 Murr
6,945,794 B1 * 9/2005 Yang et al. .......... 439/73
6,958,616 B1 * 10/2005 Mahoney et al. .......... 324/755.05
7,442,049 B2 * 10/2008 Hougham et al. .......... 439/71
7,537,462 B2 * 5/2009 Higuchi et al. .......... 439/71
7,666,029 B2 * 2/2010 Lin .......... 439/526
7,726,976 B2 * 6/2010 Mason et al. .......... 439/66
7,862,349 B1 * 1/2011 Takahashi et al. .......... 439/91
7,871,275 B1 1/2011 McClellan et al.
7,950,946 B2 * 5/2011 Liao et al. .......... 439/330
2001/0019905 A1 * 9/2001 Stefano et al. .......... 439/66
2003/0186572 A1 * 10/2003 Hougham et al. .......... 439/91
2008/0080157 A1 * 4/2008 Duppong et al. .......... 361/807
2009/0075512 A1 * 3/2009 Liao et al. .......... 439/345
2009/0124100 A1 * 5/2009 Mason et al. .......... 439/66
2012/0258616 A1 * 10/2012 Mason et al. .......... 439/88

* cited by examiner

*Primary Examiner* — Bradley Thomas
*Assistant Examiner* — Theron Milliser

(57) ABSTRACT

An electrical interconnect device includes a frame having frame walls that define a socket that extends along a socket axis between an open top and an open bottom of the frame. The socket is configured to receive an electronic package through the open top. The electrical interconnect device also includes a contact assembly having an insulative carrier that holds an array of conductive elastomeric columns with each of the elastomeric columns having opposite first and second ends. The elastomeric columns are internally conductive between the first and second ends. The elastomeric columns are configured to electrically interconnect the electronic package to a second electronic component. The insulative carrier is configured to float within the frame in a direction generally parallel to the socket axis.

20 Claims, 3 Drawing Sheets

ELECTRICAL INTERCONNECT DEVICE

BACKGROUND OF THE INVENTION

The subject matter herein relates generally to electrical interconnect devices for use between opposed arrays of contacts.

Interconnect devices are used to provide electrical connection between two or more opposing arrays of contacts for establishing at least one electrical circuit, where the respective arrays may be provided on a device, printed circuit board, Pin Grid Array (PGA), Land Grid Array (LGA), Ball Grid Array (BGA), and the like. In one interconnect technique, the electrical connection is provided by an interconnect device that is physically interposed between corresponding electrical contacts of the opposing arrays of contacts. However, the electrical connection may be unreliable due to height variations between electrical contacts of the opposing arrays, variations in thickness of a substrate supporting either of the opposing arrays or the conductive elements of the interconnect device, warping of a substrate of either of the opposing arrays, and the like.

At least some known interconnect devices use an array of elastomeric columns supported on a substrate. The elastomeric columns may be compressed to establish reliable contact between the opposing contacts. In some known interconnect devices, the elastomeric columns are conductive and provide the electrical connection. The interconnect devices are capable of accommodating size constraints, such as related to the reduced physical size of many electrical devices.

In known interconnect devices using conductive elastomeric columns, the elastomeric columns are held by an insulative carrier having coverlays provided on both sides of the insulative carrier to protect the elastomeric columns and provide mechanical stops for interfacing with the two electronic components connected by the interconnect device. The coverlays are extra layers of the interconnect device that add to the cost of the interconnect device. The interconnect devices are typically fixed within a frame and mounted to one of the electronic components. The frame and interconnect device both are removed from the electronic component to repair or replace the interconnect device. Additionally, because the interconnect device is fixed relative to the frame, the interconnect device may not properly seat or engage one or both of the electronic components. For example, one of the electronic components may be warped, causing some of the elastomeric columns to improperly connect to the electronic component.

A need remains for an electrical interconnect device that may adjust to the surface topography of the electronic components to which the electrical interconnect device is mounted.

BRIEF DESCRIPTION OF THE INVENTION

In one embodiment, an electrical interconnect device is provided including a frame having frame walls that define a socket that extends along a socket axis between an open top and an open bottom of the frame. The socket is configured to receive an electronic package through the open top. The electrical interconnect device also includes a contact assembly having an insulative carrier that holds an array of conductive elastomeric columns with each of the elastomeric columns having opposite first and second ends. The elastomeric columns are internally conductive between the first and second ends. The elastomeric columns are configured to electrically interconnect the electronic package to a second electronic component. The insulative carrier is configured to float within the frame in a direction generally parallel to the socket axis.

In another embodiment, an electrical interconnect device is provided including a frame having frame walls that define a socket that extends along a socket axis between an open top and an open bottom of the frame. The frame has a foot that extends from a corresponding frame wall into the socket. The frame has a cap that extends from a corresponding frame wall into the socket. The socket is configured to receive an electronic package through the open top. The electrical interconnect device also includes a contact assembly having an insulative carrier that holds an array of conductive elastomeric columns with each of the elastomeric columns having opposite first and second ends. The elastomeric columns are internally conductive between the first and second ends. The elastomeric columns are configured to electrically interconnect the electronic package to a second electronic component. The insulative carrier is positioned between the foot and the cap. The insulative carrier is configured to float within the frame in a direction generally parallel to the socket axis. The foot defines a lower float limit for the insulative carrier. The cap defines an upper float limit for the insulative carrier.

In a further embodiment, an electrical interconnect device is provided including a frame having frame walls that define a socket that extends along a socket axis between an open top and an open bottom of the frame. The frame is configured to be mounted to an electronic component that has an array of component contacts. The socket is aligned with the array of component contacts. The socket is configured to receive, through the open top, an electronic package that has an array of package contacts. A contact assembly has an insulative carrier that holds an array of conductive elastomeric columns. The elastomeric columns are internally conductive. The elastomeric columns are configured to electrically interconnect the component contacts and corresponding package contacts. The contact assembly is movable with respect to the frame. The contact assembly is removable from the socket without removing the frame from the electronic component.

DETAILED DESCRIPTION OF THE INVENTION

Figure 1:
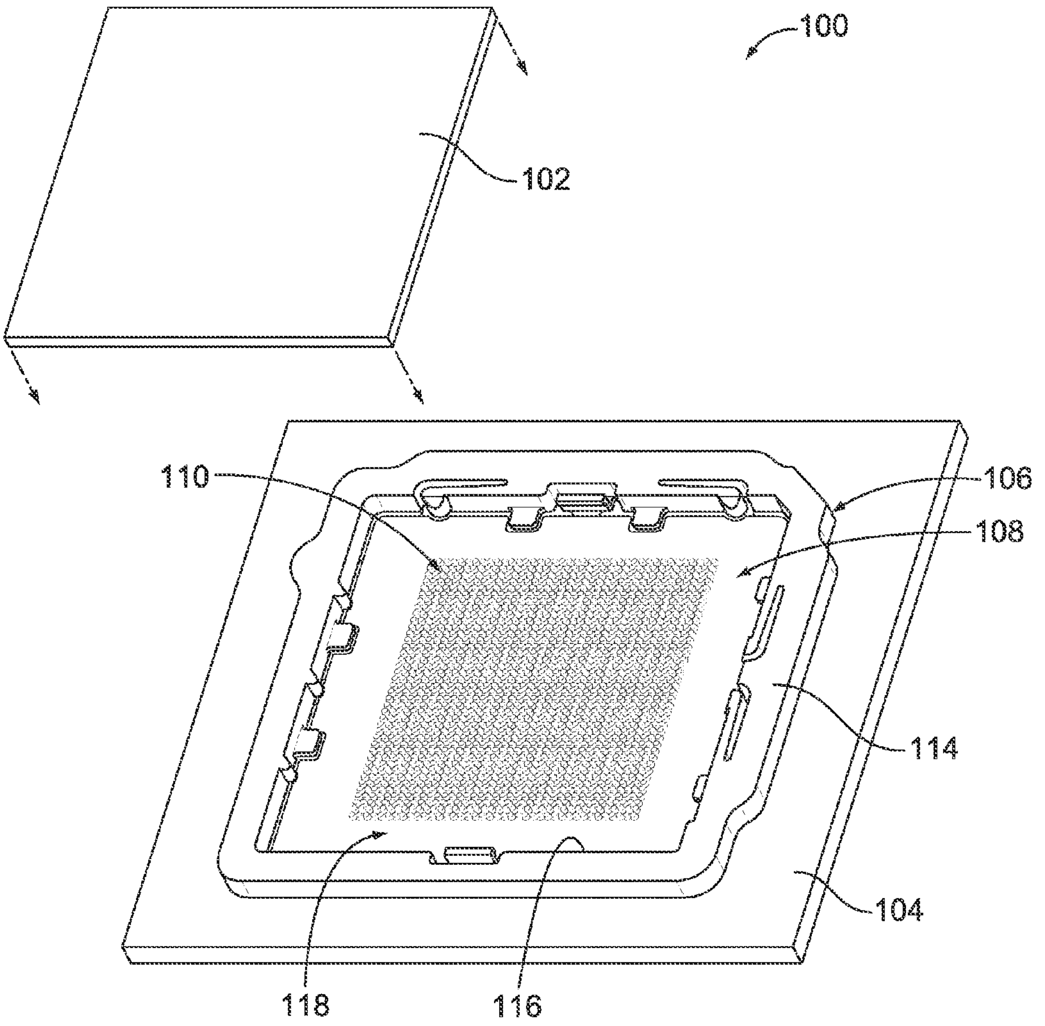
FIG. 1 illustrates an electrical interconnect system formed in accordance with an exemplary embodiment.

FIG. 1 illustrates an electrical interconnect system 100 formed in accordance with an exemplary embodiment. The system 100 includes a first electrical component 102, a second electrical component 104, and an interconnect device 106 therebetween. The interconnect device 106 is illustrated mounted to the second electrical component 104. The first electrical component 102 is illustrated poised for mounting to the interconnect device 106. The first and second electrical components 102, 104 both have an array of contacts, such as land grid arrays, ball grid arrays and the like that are electrically connected together by the interconnect device 106.

In the illustrated embodiment, the first electrical component 102 is an electronic package, such as a chip or processor. The second electrical component 104 is a printed circuit board. The interconnect device 106 constitutes a socket that is mounted to the printed circuit board and is configured to receive the chip. In alternative embodiments, other types of electrical components may be interconnected by the interconnect device 106. For example, both the first and second electrical components 102, 104 may be printed circuit boards.

The interconnect device 106 has a contact assembly 108 that is used to electrically connect the first and second electrical components 102, 104. For example, the contact assembly 108 is configured to engage the arrays of contacts of the first and second electrical components 102, 104. The contact assembly 108 has a first mating surface 110 and a second mating surface 112 (shown in FIG. 2). The first mating surface 110 is configured to be electrically connected to the first electrical component 102. The second mating surface 112 is configured to be electrically connected to the second electrical component 104.

The interconnect device 106 includes a frame 114 having a plurality of frame walls 116 that define a socket 118. The frame 114 is configured to be mounted to the second electrical component 104, such as by using latches, fasteners and the like. The socket 118 receives the first electrical component 102 therein. The contact assembly 108 is held within the frame 114 such that the contact assembly 108 interconnects the first and second electrical components 102, 104. In an exemplary embodiment, the contact assembly 108 is removable from the frame 114 such that the contact assembly 108 may be removed and replaced while leaving the frame 114 attached to the second electrical component 104.

In an exemplary embodiment, the contact assembly 108 is configured to float within the frame 114 to properly align the second mating surface 112 with the second electrical component 104 and/or align the first mating surface 110 with the first electrical component 102. The floating of the contact assembly 108 within the frame 114 allows the contact assembly 108 to adjust to the surface topography of the second electrical component 104 and/or the first electrical component 102. For example, the mating surface of the second electrical component 104 may be non-planar, or may be non-parallel to the orientation of the frame 114 of the interconnect device 106, causing height variations between the first and second electrical components 102, 104. The second electrical component 104 may have variations in the thickness of the substrate of the circuit board such that the array of contacts on the surface of the second electrical component 104 is non-planar. The substrate of the second electrical component 104 may be warped due to exposure to high heat or may be non-planar due to manufacturing tolerances causing the array of contacts to be either non-planar or non-parallel a plane defined by the frame 114. Having the ability of the contact assembly 108 to float within the frame 114, and thus have a variable orientation with respect to the frame 114, allows the contact assembly 108 to be more accurately positioned between the first and second electrical components 102, 104.

Figure 2:
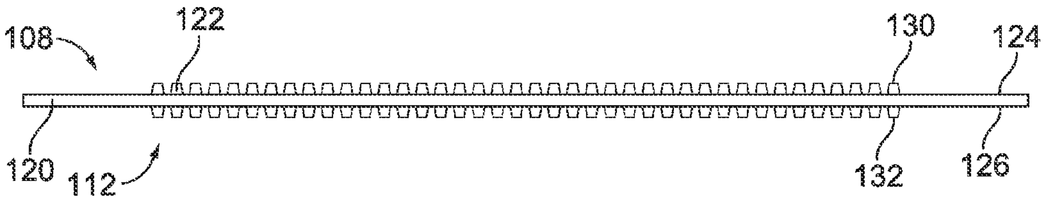
FIG. 2 is a side view of the contact assembly formed in accordance with an exemplary embodiment.

FIG. 2 is a side view of the contact assembly 108. The contact assembly 108 includes an insulative carrier 120 holding an array of elastomeric columns 122. The insulative carrier 120 may have one or more layers. The insulative carrier 120 extends between a first side 124 and a second side 126. The insulative carrier 120 is fabricated from an insulative material, such as a polyimide material that may be arranged as a polyimide film, such as a Kapton® material. Optionally, one or more outer layers, such as a coverlay and a bonding layer may be applied to the first side 124 and/or the second side 126.

The elastomeric columns 122 are arranged in an array having a predetermined pattern or layout that corresponds to the array of contacts of the first electrical component 102 and the second electrical component 104. The elastomeric columns 122 extend outward from both the first and second sides 124, 126. The elastomeric columns 122 extend between a first end 130 and a second end 132 opposite the first end 130. In an exemplary embodiment, the elastomeric columns 122 are frustoconically shaped, being wider about the mid-section and narrower at the first and second ends 130, 132. The elastomeric columns 122 are held at the mid-section by the insulative carrier 120. In an exemplary embodiment, the elastomeric columns 122 are conductive elastomeric columns, such as columns fabricated from a mixture of an elastic material and conductive flakes. The elastomeric columns 122 provide conductive paths between the first and second ends 130, 132. In an exemplary embodiment, the elastomeric columns 122 are metalized particle interconnects. The elastomeric columns 122 are at least partially compressible, such as when the first electrical component 102 is mounted to the contact assembly 108.

Figure 3:
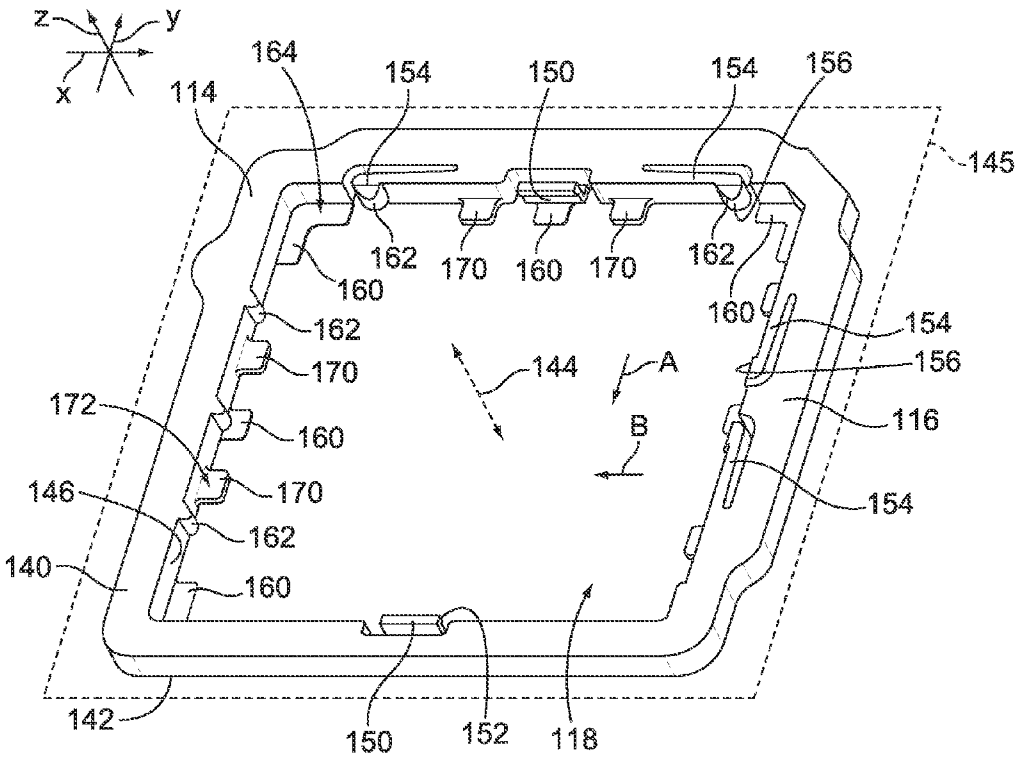
FIG. 3 is a top perspective view of the frame of the interconnect device.
Figure 4:
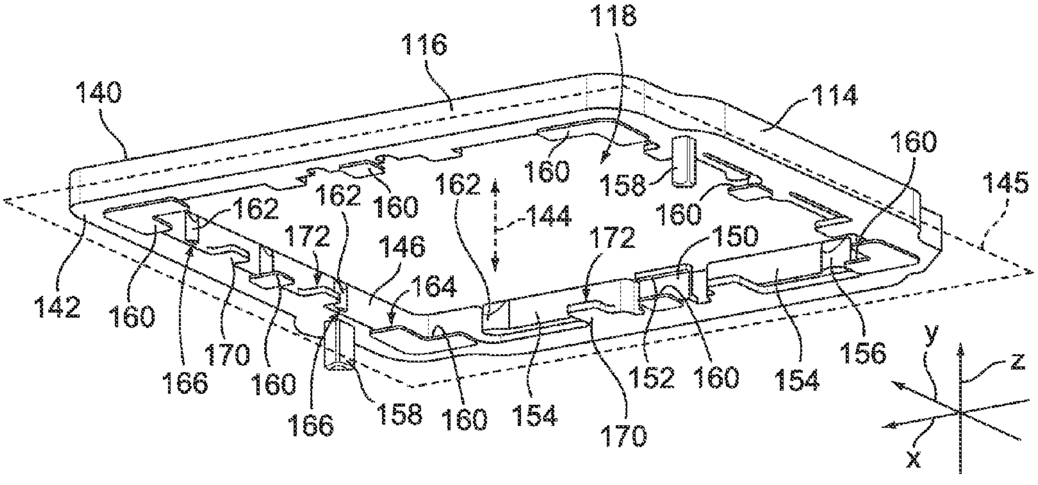
FIG. 4 is a bottom perspective view of the frame of the interconnect device.

FIGS. 3 and 4 are top and bottom perspective views, respectively, of the frame 114 of the interconnect device 106 (shown in FIG. 1). In the illustrated embodiment, the frame 114 includes four frame walls 116 defining a generally square shaped socket 118. Any number of frame walls 116 may be provided in alternative embodiments, defining a socket 118 having any shape. In the illustrated embodiment, all of the frame walls 116 are connected defining a one-piece, unitary frame 114. In alternative embodiments, the frame 114 may be defined by separate and discrete frame pieces that define one or more of the frame walls 116. For example, two right angle frame pieces may cooperate to define the socket 118, where the individual frame pieces are separately mounted to the second electrical component 104 (shown in FIG. 1). Other configurations are possible in alternative embodiments.

In an exemplary embodiment, the frame 114 has an open top 140 and an open bottom 142. The socket 118 extends along a socket axis 144 (e.g., in the Z direction) between the open top 140 and the open bottom 142. The socket axis 144 may be oriented generally perpendicular to a frame plane 145 defined by the bottom 142 (e.g., a plane extending in the X-Y direction). The socket axis 144 is generally parallel to interior surfaces 146 of the frame walls 116. In an exemplary embodiment, the first electrical component 102 (shown in FIG. 1) may be loaded into the socket 118 through the open top 140. The open bottom 142 of the frame 114 is configured to be mounted to the second electrical component 104. The array of contacts of the second electrical component 104 is exposed through the open bottom 142. The contact assembly 108 is loaded into the socket 118 through the open top 140. The contact assembly 108 is positioned in the socket 118 such that the contact assembly 108 engages the array of contacts of the second electrical component 104 through the open bottom 142.

The frame 114 includes a pair of retention clips 150 used to retain the first electrical component 102 (shown in FIG. 1) within the socket 118. Any number of retention clips 150 may be used to hold the first electrical component 102 within the socket 118. Other types of retaining features may be used in alternative embodiments to secure the first electrical component 102 to the interconnect device 106. The retention clips 150 have catch surfaces 152 that are downward facing and that engage an outer surface of the first electrical component 102 to hold the first electrical component 102 within the socket 118. The retention clips 150 may be released to remove the first electrical component 102 from the socket 118.

The frame 114 includes a plurality of biasing springs 154 that extend from corresponding frame walls 116 into the socket 118. The biasing springs 154 have engagement surfaces 156 that engage the first electrical component 102. The biasing springs 154 are biased against the first electrical component 102 when the first electrical component 102 is received in the socket 118 to position the first electrical component 102 within the socket 118. In the illustrated embodiment, the biasing springs 154 are provided along two perpendicular frame walls 116. The biasing springs 154 tend to force the first electrical component 102 in the direction of arrow A and in the direction of arrow B generally away from the frame walls 116 having the biasing springs 154. The biasing springs 154 tend to force the first electrical component 102 to the corner generally opposite the intersection of the frame walls 116 having the biasing springs 154. The biasing springs 154 are cantilevered beams extending at least partially into the socket 118. The biasing springs 154 are deflected when the first electrical connector 102 is loaded into the socket 118, creating an internal bias within the biasing springs 154 that forces the first electrical component 102 away from the frame walls 116 having the biasing springs 154. Any number of biasing springs 154 may be provided. Any of the frame walls 116 may have biasing springs 154, including all of the frame walls 116.

The frame 114 includes one or more alignment posts 158 extending from the bottom 142. The alignment posts 158 are configured to be received within corresponding alignment openings (not shown) in the second electrical component 104 to position the frame 114 with respect to the second electrical component 104. Other types of alignment features may be used rather than the alignment posts 158 to orient the frame 114 with respect to the second electrical component 104. Optionally, the alignment posts 158 may be keyed to properly orient the frame 114 with respect to the second electrical component 104. For example, one of the alignment posts 158 may have a first shape, such as a rectangular shape, while the other alignment posts 158 may have a second shape, such as a triangular shape to avoid placing the alignment posts 158 in the wrong alignment opening in the second electrical component 104. Optionally, the alignment posts 158 may be secured in the alignment openings, such as by an interference fit.

The frame 114 includes a plurality of protrusions extending into the socket 118 from the frame walls 116 that support and/or block the contact assembly 108 within the socket 118. The protrusions define a floating envelope that limits the range of floating movement of the contact assembly 108 within the frame 114. The frame 114 thus controls the amount of floating of the contact assembly 108 within the socket 118. In the illustrated embodiment, the protrusions include feet 160 extending from the frame walls 116 into the socket 118 and caps 162 extending from the frame walls 116 into the socket 118. Each foot 160 defines a lower float limit for the contact assembly 108. Each cap 162 defines an upper float limit for the contact assembly 108. Any number of feet 160 and caps 162 may be provided. The feet 160 and the caps 162 may have any size or shape in order to support and/or block movement of the contact assembly 108 within the socket 118. Each foot 160 has an upward facing ledge 164. Each cap has a downward facing ledge 166. The upward facing ledge 164 defines the lower float limit for the contact assembly 108. The downward facing ledge 166 defines the upper float limit for the contact assembly 108. In the illustrated embodiment, the feet 160 and the caps 162 are offset with respect to one another with one or more caps 162 positioned between the feet 160. In the illustrated embodiment, the upward facing ledges 164 of the feet 160 have a greater surface area than the downward facing ledges 166 of the caps 162. In alternative embodiments, the feet and caps 160, 162 may be sized similar to one another. In an exemplary embodiment, the feet 160 are provided at the bottom 142. The caps 162 are provided at some vertical location (e.g., along the Z direction) above the bottom 142. The caps 162 are spaced vertically above the feet 160 such that a gap or space is created between the upward facing ledge 164 and downward facing ledge 166. The gap or space defines the floating envelope for the contact assembly 108.

The frame 114 includes a plurality of compression stops 170 extending from corresponding frame walls 116 into the socket 118. The compression stops 170 define mechanical stops for the loading of the first electrical component 102 into the socket 118. For example, upper surfaces 172 of the compression stops 170 limit loading of the first electrical component 102 into the socket 118. The first electrical component 102 is loaded into the socket 118 until the first electrical component 102 engages the upper surfaces 172 of the compression stops 170.

Figure 5:
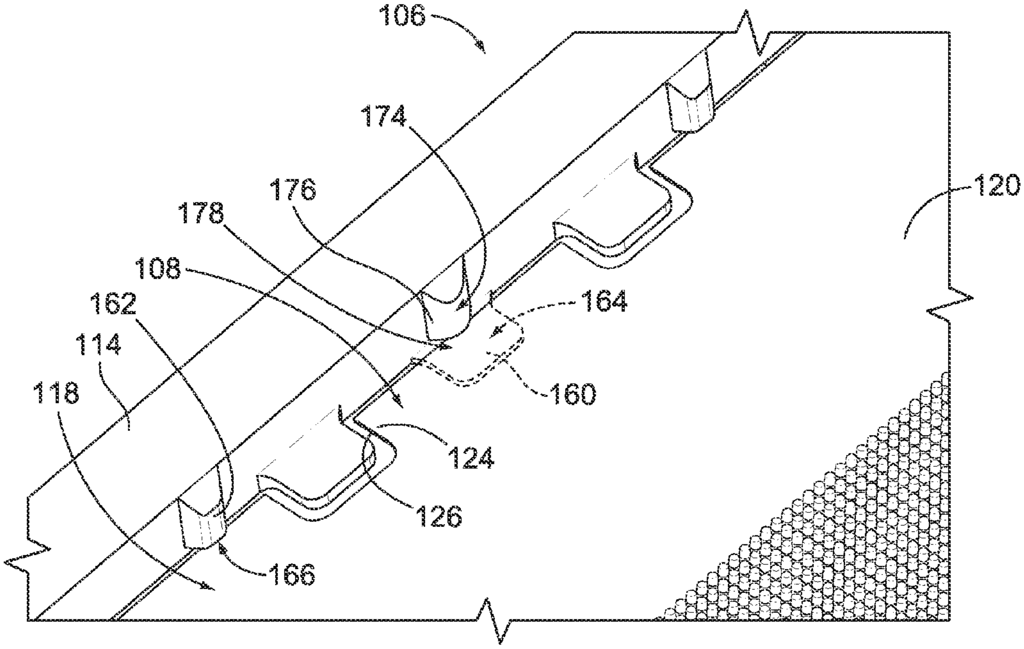
FIG. 5 illustrates a portion of the interconnect device showing the contact assembly received in the frame.

FIG. 5 illustrates a portion of the interconnect device 106 showing the contact assembly 108 received in the frame 114. The contact assembly 108 is received in the socket 118 such that the first side 124 of the insulative carrier 120 faces and/or rests against the downward facing ledge 166 of the caps 162. The second side 126 of the insulative carrier 120 faces and/or pressed against the upward facing ledge 164 of the feet 160. The insulative carrier 120 may be positioned at any vertical position within the floating envelope between the upward facing ledge 164 and the downward facing ledge 166.

The frame 114 includes alignment features 174 extending from corresponding frame walls 116 into the socket 118. The alignment features 174 orient the contact assembly 108 within the socket 118. In the illustrated embodiment, the alignment features 174 constitute posts extending from the frame walls 116 into the socket 118. Side walls 176 of the alignment features 174 engage a cutout 178 of the insulative carrier 120 to position the contact assembly 108 within the socket 118. For example, the alignment features 174 may orient the contact assembly 108 in the X and/or Y direction.

Figure 6:
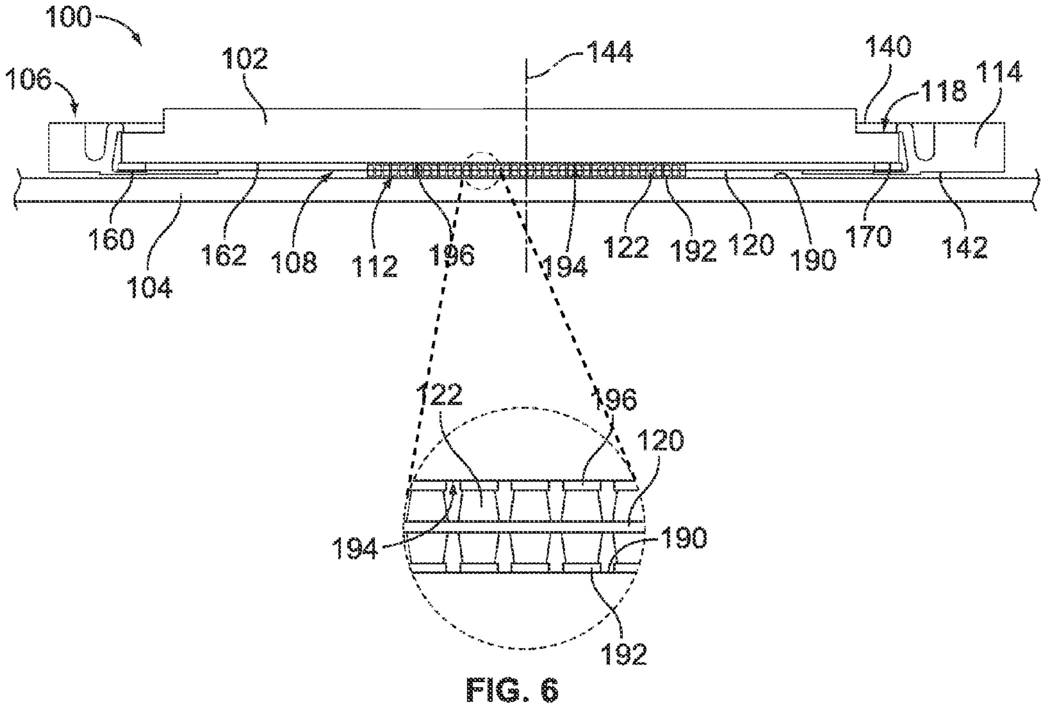
FIG. 6 is a partial sectional view of the electrical interconnect system shown in FIG. 1.

FIG. 6 is a partial sectional view of the electrical interconnect system 100 showing the interconnect device 106 mounted to the second electrical component 104 and showing the first electrical component 102 received within the socket 118. During assembly, the frame 114 is mounted to a mounting surface 190 of the second electrical component 104 above an array of component contacts 192 of the second electrical component 104. The frame 114 may be secured to the second electrical component 104 using a latch, fasteners or other securing means.

The contact assembly 108 is loaded into the socket 118. Optionally, the contact assembly 108 may be loaded into the frame 114 through the open top 140 after the frame 114 is mounted to the second electrical component 104. Alternatively, prior to mounting the frame 114 to the second electrical component 104, the contact assembly 108 may be loaded into the socket 118 and the interconnect device 106 may be mounted to the second electrical component 104 as a unit.

The contact assembly 108 is received in the socket 118 such that second mating surface 112 extends along the mounting surface 190 of the second electrical component 104. The contact assembly 108 is able to float within the socket 118 to match the surface topography of the mounting surface 190. For example, the mounting surface 190 may be non-planar, with the component contacts 192 defining a component contact plane being non-parallel to the frame plane 145 defined by the bottom 142 of the frame 114. In some embodiments, due to manufacturing tolerances, improper assembly, damage to or degradation of the frame 114 or second electrical connector 104 over time or other factors, the bottom 142 of the frame 114 may be oriented on the mounting surface 190 in a skewed or non-parallel orientation. No matter what the reason, the contact assembly 108 is variably positionable within the socket 118 to accommodate offset or tolerances between the frame 114 and the second electrical component 104. The insulative carrier 120 is configured to float within the frame 114 in a direction generally parallel to the socket axis 144 (e.g., in the Z direction). Optionally, one side or the other of the insulative carrier 120 may float more or less than the other side, making the insulative carrier 120 slanted within the socket 118, such that one edge of the insulative carrier 120 is closer to the feet 160, while the opposite edge of the insulative carrier 120 is closer to the caps 162. The feet 160 define the lower float limit for the insulative carrier 120. The caps 162 define the upper float limit for the insulative carrier 120. Optionally, the insulative carrier 120 may be flexible. The flexibility of the insulative carrier 120 allows the insulative carrier 120 and the elastomeric columns 122 to conform to undulations in the plane defined by the component contacts 192 and the plane defined by the package contacts 196.

When mated, the first electrical component 102 is loaded into the socket 118. As the first electrical component 102 is loaded into the socket 118, a mating interface of the first electrical component 102 engages the contact assembly 108. The first electrical component 102 includes the array of package contacts 196 at the mating interface 194. The package contacts 196 engage corresponding elastomeric columns 122. When the first electrical component 102 is removed from the socket 118, the contact assembly 108 may be removed from the socket 118 without removing the frame 114 from the second electrical component 104. For example, the flexibility of the insulative carrier 120 may allow one or more sides to be removed from the frame 114, thus allowing the contact assembly 108 to be removed from the socket 118. The contact assembly 108 may be replaced by another contact assembly 108 such as to repair a damaged contact assembly 108 or to use a contact assembly 108 that has a different configuration of elastomeric columns 122.

The first electrical component 102 is loaded into the socket 118 until the bottom of the first electrical component 102 engages the compression stops 170. The compression stops 170 limit the amount of compression of the elastomeric columns 122. The compression stops 170 prevent damage to the elastomeric columns 122 from overloading the first electrical component 102. Because the compression stops 170 stop the loading of the first electrical component 102 into the socket 118, the contact assembly 108 may be used without a coverlay over the insulative carrier 120. As such, the contact assembly 108 may be manufactured at less cost than a contact assembly 108 that includes a coverlay. For example, the material cost of the contact assembly 108 may be reduced, as well as assembly cost of the contact assembly 108.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical interconnect device comprising:

a frame having frame walls with interior surfaces defining a socket extending along a socket axis between an open top and an open bottom of the frame, the socket being configured to receive an electronic package through the open top; and a contact assembly having an insulative carrier holding an array of conductive elastomeric columns, the insulative carrier having exterior edges, each of the elastomeric columns having opposite first and second ends, the elastomeric columns being internally conductive between the first and second ends, the elastomeric columns being configured to electrically interconnect the electronic package to a second electronic component, contact assembly being received within the socket such that the exterior edges face the interior surface, the insulative carrier being unsecured relative to the frame to allow the exterior edges to be movable and float relative to the frame along the interior surfaces within the socket in a direction generally parallel to the socket axis.

2. The electrical interconnect device of claim 1, wherein the frame controls the amount of floating of the insulative carrier within the socket.

3. The electrical interconnect device of claim 1, wherein the frame includes protrusions extending into the socket from the frame walls, the protrusions defining a floating envelope along the socket axis that limits the range of floating movement of the insulative carrier within the socket, the insulative carrier being free floating within the limits of the floating envelope.

4. The electrical interconnect device of claim 1, wherein the entire insulative carrier is contained within the socket and is movable within the socket.

5. The electrical interconnect device of claim 1, wherein the frame is configured to be mounted to an electrical component having a mounting surface and an array of component contacts on the mounting surface, a component contact plane being defined by a first component contact and a second component contact, the insulative carrier being oriented in the frame parallel to the component contact plane irrespective of the orientation of the component contact plane with respect to a frame plane defined by the bottom of the frame.

6. The electrical interconnect device of claim 1, wherein the frame is configured to be mounted to an electrical component, the contact assembly being removable from the socket without removing the frame from the electrical component.

7. The electrical interconnect device of claim 1, wherein the frame has a foot extending from a corresponding frame wall into the socket, and wherein the frame has a cap extending from a corresponding frame wall into the socket, the foot and cap being offset in a direction along the socket axis, the insulative carrier being positioned between the foot and the cap, the insulative carrier being free floating between the foot and the cap with the foot defining a lower float limit for the insulative carrier, the cap defining an upper float limit for the insulative carrier.

8. The electrical interconnect device of claim 7, wherein the insulative carrier is planar having a first surface and a second surface, the exterior edges extending between the first and second surfaces, the first surface, at the exterior edges, engaging the cap at the upper float limit, the second surface, at the exterior edges, engaging the foot at the lower float limit.

9. An electrical interconnect device comprising:

a frame having frame walls defining a socket extending along a socket axis between an open top and an open bottom of the frame, the frame having a foot extending from a corresponding frame wall into the socket, the frame having a cap extending from a corresponding frame wall into the socket, the socket being configured to receive an electronic package through the open top; and a contact assembly having an insulative carrier holding an array of conductive elastomeric columns, each of the elastomeric columns having opposite first and second ends, the elastomeric columns being internally conductive between the first and second ends, the elastomeric columns being configured to electrically interconnect the electronic package to a second electronic component, the insulative carrier being planar and having a first surface and a second surface, the insulative carrier being positioned between the foot and the cap, the contact assembly being unsecured relative to the frame to allow the contact assembly to be movable and float relative to the frame within the socket in a direction generally parallel to the socket axis, the foot defining a lower float limit for the insulative carrier, the cap defining an upper float limit for the insulative carrier, wherein the contact assembly floats within the socket until the first surface engages the cap at the upper float limit and until the second surface engages the foot at the lower float limit.

10. The electrical interconnect device of claim 9, wherein the frame defines a floating envelope between the foot and the cap.

11. The electrical interconnect device of claim 9, wherein the entire insulative carrier is contained within the socket and is movable within the socket.

12. The electrical interconnect device of claim 9, wherein the foot has an upward facing ledge and the cap has a downward facing ledge, the upward facing ledge defines the lower float limit, the downward facing ledge defines the upper float limit.

13. The electrical interconnect device of claim 9, wherein the frame includes a plurality of feet and a plurality of caps spaced apart along the frame walls.

14. The electrical interconnect device of claim 9, further comprising a compression stop extending from a corresponding frame wall into the socket, the compression stop defining a mechanical stop for loading of the electronic package into the socket.

15. The electrical interconnect device of claim 9, further comprising biasing springs extending from corresponding frame walls into the socket, the biasing springs being configured to engage the electronic package to position the electronic package within the socket.

16. The electrical interconnect device of claim 9, wherein the frame is configured to be mounted to an electrical component having a mounting surface and an array of component contacts on the mounting surface, a component contact plane being defined by a first component contact and a second component contact, the insulative carrier being oriented in the frame parallel to the component contact plane irrespective of the orientation of the component contact plane with respect to a frame plane defined by the bottom of the frame.

17. The electrical interconnect device of claim 9, wherein the frame is configured to be mounted to an electrical component, the contact assembly being removable from the socket without removing the frame from the electronic component.

18. An electrical interconnect device comprising:

a frame having frame walls defining a socket extending along a socket axis between an open top and an open bottom of the frame, the frame being configured to be mounted at the open bottom to an electronic component having an array of component contacts exposed through the open bottom, the socket being aligned with the array of component contacts, the socket being configured to receive, through the open top, an electronic package having an array of package contacts; and a contact assembly having an insulative carrier holding an array of conductive elastomeric columns, the elastomeric columns being internally conductive, the elastomeric columns being configured to electrically interconnect the component contacts and corresponding package contacts, the contact assembly being entirely contained within the socket, the insulative carrier being unsecured relative to the frame to allow the contact assembly to be movable within the socket and float with respect to the frame within the socket in a direction generally parallel to the socket axis, the contact assembly being removable from the socket through the open top without removing the frame from the electronic component.

19. The electrical interconnect device of claim 18, wherein the frame includes protrusions extending into the socket from the frame walls, the protrusions defining a floating envelope that limits the range of floating movement of the insulative carrier within the socket.

20. The electrical interconnect device of claim 18, wherein the elastomeric columns float with the insulative carrier within the socket.

* * * * *